(12) United States Patent
Tonn

(10) Patent No.: US 7,288,944 B1
(45) Date of Patent: Oct. 30, 2007

(54) EVANESCENT WAVEGUIDE APPARATUS AND METHOD FOR MEASUREMENT OF DIELECTRIC CONSTANT

(75) Inventor: David A. Tonn, Charlestown, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/183,307

(22) Filed: Jul. 11, 2005

(51) Int. Cl.
*G01R 27/26* (2006.01)
*G01R 27/04* (2006.01)
*H01P 5/12* (2006.01)

(52) U.S. Cl. .................. 324/639; 324/637; 333/108
(58) Field of Classification Search ................ 324/637, 324/639; 333/108
See application file for complete search history.

(56) References Cited

U.S. PATENT DOCUMENTS

| | | | | |
|---|---|---|---|---|
| 4,761,625 A * | 8/1988 | Sharma | ...................... | 333/209 |
| 4,891,573 A | 1/1990 | Kent | ........................... | 324/639 |
| 4,996,489 A | 2/1991 | Sinclair | ...................... | 324/639 |
| 5,001,433 A | 3/1991 | Osaki | .......................... | 424/632 |
| 5,103,181 A | 4/1992 | Gaisford et al. | ............ | 424/637 |
| 5,455,516 A * | 10/1995 | Jean et al. | ................... | 324/639 |
| 6,107,901 A * | 8/2000 | Crouch et al. | .............. | 333/239 |
| 6,392,508 B1 * | 5/2002 | Damphousse et al. | ...... | 333/209 |
| 6,657,520 B2 * | 12/2003 | Mack et al. | ................. | 333/208 |
| 6,724,280 B2 * | 4/2004 | Shamsaifar et al. | ........ | 333/209 |

* cited by examiner

*Primary Examiner*—Andrew H. Hirshfeld
*Assistant Examiner*—John Zhu
(74) *Attorney, Agent, or Firm*—James M. Kasischke; Jean-Paul A. Nasser; Michael P. Stanley

(57) ABSTRACT

A dielectric constant waveguide measuring apparatus preferably comprises a rectangular waveguide aperture on each end with a width a and height b. The waveguide frame is preferably split to permit the waveguide to be opened for insertion of the unknown material into a middle reduced cross-sectional area portion of the waveguide frame. In one embodiment, a metal septum is inserted between two samples of the unknown material to thereby reduce the cross-sectional area of the waveguide aperture by splitting width a of the rectangular waveguide in half. The waveguide frame is closed and a frequency response of the waveguide is then measured. The dynamic dielectric constant of the unknown material is determined from the frequency of the lowest order minimum value of the frequency response of the waveguide apparatus wherein the unknown material has been inserted.

1 Claim, 6 Drawing Sheets

EVANESCENT WAVEGUIDE APPARATUS AND METHOD FOR MEASUREMENT OF DIELECTRIC CONSTANT

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

The present invention relates generally to measuring the dielectric constant of an unknown material and, more specifically, to a waveguide apparatus and method to thereby determine the dielectric constant.

(2) Description of the Prior Art

The dielectric constant of a material is an essential parameter that is important to know with confidence when doing electromagnetics work. This parameter, denoted $\epsilon_r$, may be utilized to determine the wave number of an electromagnetic wave in a material and as a result, the phase velocity, guided wavelength, and so forth, of the electromagnetic wave.

Current methods for measuring the static dielectric constant include plating two opposite surfaces of a sample with conductive material and measuring the static capacitance that results. This is useful when the material is to be used for a capacitor or for low-frequency applications. This method may not be sufficiently informative when the material is to be used for RF applications because for most materials, the static (f=0 Hz) dielectric constant is different from that seen by a RF signal.

For RF purposes, measurement of the dielectric constant is often accomplished by use of an open-ended coaxial probe that is placed in contact with the sample and the impedance that is seen can be used to calculate $\epsilon_r$. Measurement of the dielectric constant can also be performed by transmission of an RF signal through a plate of the unknown material in an anechoic environment, i.e., an environment that is free from echoes and reverberations. Another prior art method measures the frequency at which a block of the unknown material resonates at RF. In each of these prior art methods, a large sample of the material is required along with a suitable anechoic test environment.

The following patents discuss prior art attempts to solve problems related to the above:

U.S. Pat. No. 4,891,573, issued Jan. 2, 1990, to Gordon D. Kent, discloses a ceramic or other substrate, which is tested for dielectric constant K, and loss tangent by placing it on a central transverse plane across a cylindrical waveguide. A swept-frequency signal is injected into the waveguide at an input coupling loop and is picked up at an output coupling loop. Maximum transmission through the dielectric substrate occurs at a frequency that depends on the waveguide radius, the substrate thickness, and the dielectric constant. The dielectric constant can be obtained from the resonant frequency of a predetermined transmission mode. The loss tangent can be calculated from the transmission bandwidth. The measurement of the dielectric constant is insensitive to the position of the substrate in the gap between waveguide sections, and thus intimate contact is not required.

U.S. Pat. No. 4,996,489, issued Feb. 26, 1991, to P. L. Sinclair, discloses a system for measuring the complex dielectric constant of a core sample. The system incorporates a circular waveguide having a central axial transmitter coil. Equally spaced axial receiver coils are placed on both sides of the transmitter coil. The opposite polarity receiver signals are connected to an adder circuit to provide an output signal representing only the difference in the two received signals. By placing a standard, such as air, between the transmitter coil and one receiver coil, and a core sample positioned between the transmitter coil and the other receiver coil, the system obtains an output indicative of complex dielectric constant. Optionally, the system is operated in an oven to provide an elevated temperature, and can also be pressurized with a compressed fluid.

U.S. Pat. No. 5,001,433, issued Mar. 19, 1991, to S. Osaki, discloses apparatus and method for measuring electric characteristics of sheet-like materials using an instrument which includes a waveguide tube member having one end connected to transmitter for introducing a microwave into the tube member and the other end fully opened, a waveguide terminal member having an opened end facing the opened end of the tube member to form slit of the whole wave guide body constituted from the tube and terminal members and having the other end connected to first microwave detector, and an auxiliary waveguide branching from the wall portion of said tube member adjacent to the slit with the branch-extension end being associated with a second microwave detector.

U.S. Pat. No. 5,103,181, issued Apr. 7, 1992, to Gaisford et al., discloses radio frequency bridge techniques used to parameterize the complex dielectric properties of solids, liquids, gasses and mixtures thereof. This parameterization is performed in an electrically isolated, physically open structure, which allows continuous or batch monitoring of the materials and their mixtures. A method and apparatus are provided for measuring the composition of multi-component process streams flowing in pipes or ducts. The method uses the pipe in which the mixture flows as a waveguide in which propagating radio frequency electromagnetic energy is induced through dielectric loaded apertures. The dielectric measurement is performed in an electrically isolated, flow through test section that induces constructive or destructive interference patterns at characteristics frequencies. The characteristic frequency determines the dielectric constant of the mixture. The dielectric properties are used in turn to determine mixture composition. A density measurement is also provided for three component streams such as oil, water, and gas. Temperature and pressure measurements are made to correct for temperature and pressure induced variations in calibrated component impedance and density values.

The above cited prior art does not provide an apparatus and method utilizing an air-filled metallic waveguide fitted with a metal (e.g. brass) septum or plate that divides the waveguide in half for a portion of its length whereby the material to be measured is fitted in the waveguide on either side of the metal sheet. The above-cited prior art does not show a tapered or restricted diameter waveguide that may be utilized with a single sample of the material without requiring a metal sheet. The above-cited prior art does not utilize a waveguide section operated in a cutoff or evanescent mode. Moreover, it would be desirable to be able to measure the dielectric constant of a sample material without the need to accurately measure the length of the sample.

The solutions to the above-described problems are highly desirable but have never been obtained or available in the prior art. Consequently, those skilled in the art will appreciate the present invention that addresses the above and other problems.

SUMMARY OF THE INVENTION

An object of the present invention is to provide an improved apparatus and method to determine the dynamic dielectric constant of an unknown material.

An advantage of the present invention is that a very small sample may be utilized.

Another advantage of the present invention is that the method does not require a shielded or anechoic environment.

A feature of the present invention is a split waveguide having a reduced cross-sectional area in a middle portion thereof.

These and other objects, features, and advantages of the present invention will become apparent from the drawings, the descriptions given herein, and the appended claims. However, it will be understood that above listed objects and advantages of the invention are intended only as an aid in understanding aspects of the invention, are not intended to limit the invention in any way, and do not form a comprehensive list of objects, features, and advantages.

Accordingly, the present invention provides an apparatus for measuring a dielectric constant of an unknown material that may comprise one or more elements such as, for example, a waveguide frame that defines a rectangular cross-section waveguide aperture there through. The waveguide frame comprises a first end on one side of the waveguide aperture and a second end on an opposite side of the waveguide aperture. The first end and the second end define the waveguide aperture with a width a and a height b wherein the width a is greater than the height b. The waveguide frame is split along a length of the waveguide to permit the waveguide frame to be opened and closed. The waveguide frame has a middle section with at least one reduced waveguide aperture portion comprising a reduced width less than the width a. At least one sample of the unknown material is utilized and has a width equal to the reduced width a and height b to thereby mate with the reduced waveguide aperture portion. The at least one sample of unknown material is insertable into the middle section when the waveguide frame is opened and then mates to the reduced waveguide aperture portion when the waveguide frame is closed to permit measurement of the dielectric constant of the sample of unknown material.

In one embodiment, the apparatus may further comprise a metal septum insertable into the middle section of the waveguide frame for dividing the waveguide width a into one-half whereby the reduced waveguide aperture portion actually comprises two reduced waveguide aperture portions. For this embodiment, two samples of the unknown material are insertable on opposite sides of the metal septum. The metal septum may be comprised of brass. The metal septum has a septum length, and the two samples may preferably have a length equal to the septum length.

In a preferred embodiment, the reduced width for the waveguides discussed above has a width of a/2 such that this section of the waveguide operates in a cutoff or near evanescent mode. Preferably, the first end and the second end of the waveguide are conveniently filled with air.

A method is provided for determining a dielectric constant of an unknown material which may comprise one or more steps such as, for instance, providing a split waveguide frame with first and second ends defining a cross-sectional area for a waveguide when the split waveguide frame is closed together, and/or providing at least one restriction in a middle section of the split waveguide frame between the first and second ends to define at least one reduced cross-sectional area waveguide, and/or making at least one sample of the unknown material with a size and shape to mate with the at least one reduced cross-sectional area waveguide in the middle section. Other steps may comprise opening the split waveguide frame, inserting the at least one sample into the middle section of the split waveguide frame, closing the split waveguide frame, and/or measuring a frequency response of the split waveguide frame with the at least one sample therein.

The method may further comprise determining a lowest order minimum from the frequency response of the split waveguide with the sample therein. Other steps may comprise determining the dielectric constant of the unknown material from the lowest order minimum of the frequency response of the split waveguide utilizing a graph for visual determination or equations discussed hereinafter for calculating the value.

The method may further comprise inserting a metal septum into the middle section of the split waveguide frame between to thereby define two reduced cross-sectional area waveguide apertures wherein the method further comprises inserting two samples into the two reduced cross-sectional area waveguide apertures. Alternatively, the method comprises providing internally tapering sections of the split waveguide frame on either side of the middle section.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings, wherein like reference numerals refer to like parts and wherein.

DESCRIPTION OF THE PREFERRED EMBODIMENT

The present invention provides a tool for measuring the dynamic (as opposed to static) dielectric constant of an unknown material in the microwave regime by using only a small sample placed in a cutoff section of a preferably rectangular waveguide. Only a very small sample of the unknown material is required. Because the measurement can take place without the need to build a shielded or anechoic environment, the cost and effort involved in measuring the dielectric constant is reduced.

It is well known from microwave theory that rectangular waveguides have a lower cutoff frequency below which they cannot propagate a real energy flow. This lowest order cutoff is determined by the width of the waveguide so long as the width, a, is at least twice the height, b:

$$f_c = \frac{c}{2a\sqrt{\varepsilon_r}} \quad (1)$$

where c is the velocity of light (3×10⁸ m/s), a is the width of the waveguide in meters, and $\varepsilon_r$ is the dielectric constant of the material filling the waveguide. Above this cutoff frequency, the waveguide has a real characteristic impedance and carries a real power flow. Below the cutoff frequency, the impedance is purely imaginary and the power flow is near evanescent or imaginary.

Figure 1A:
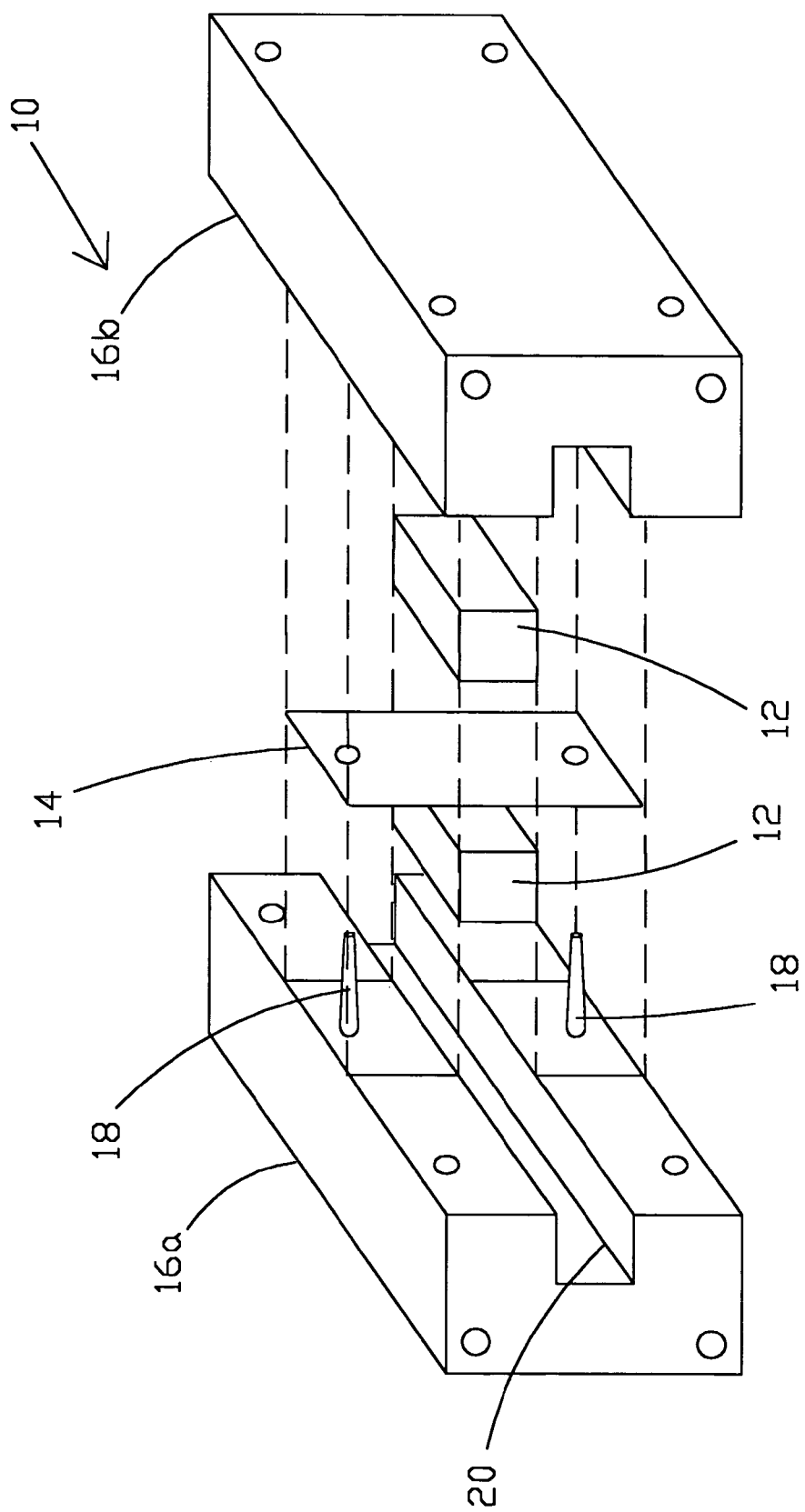
FIG. 1a is an exploded perspective view of a dielectric constant waveguide measuring apparatus in accord with one embodiment of the present invention.
Figure 1B:
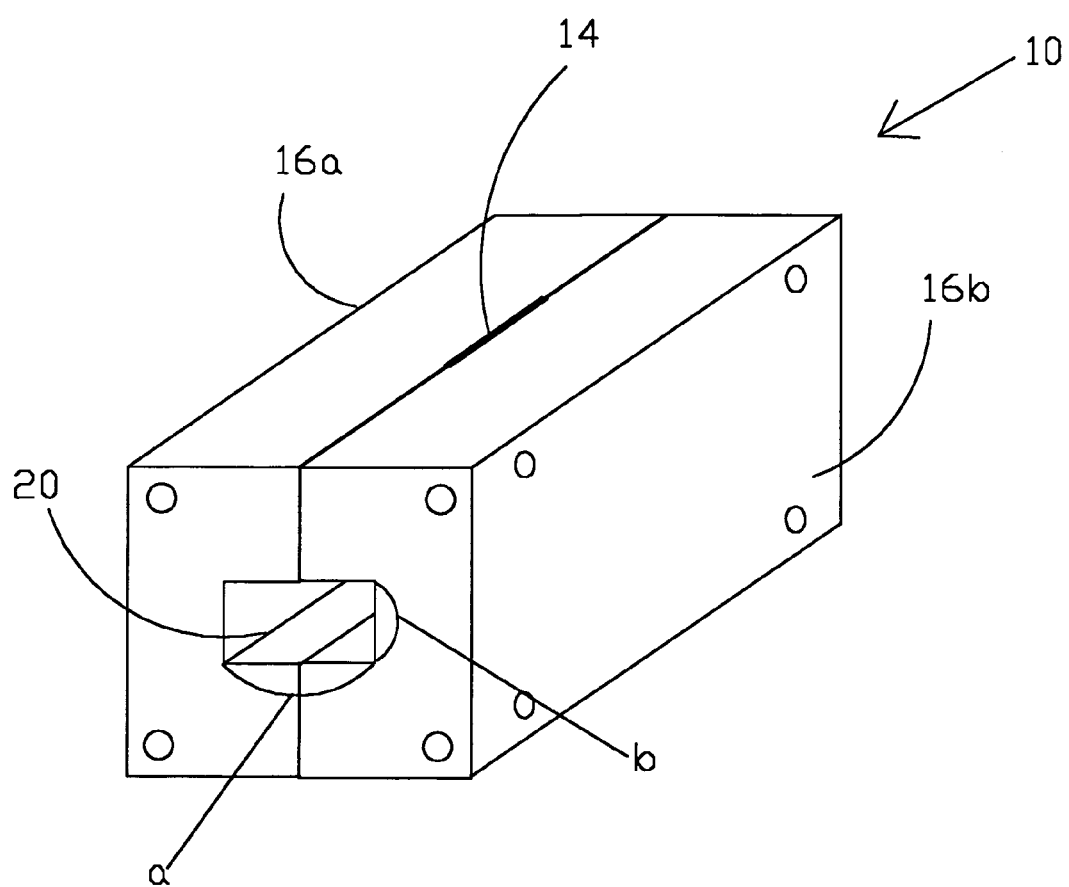
FIG. 1b is a normal perspective view of a dielectric constant waveguide measuring apparatus in accord with one embodiment of the present invention.

Referring now to the figures and, more particularly, to FIGS. 1a and 1b, there is shown an exploded and normal view of a dielectric constant waveguide measuring apparatus 10 in accord with the present invention. Apparatus 10 comprises two identical outer fixtures 16a and 16b. Each outer fixture is a rectangular metal block with a rectangular groove running the length of one side of the fixture along the longitudinal axis of the fixture. When fixture 16a is mated with fixture 16b such that the sides with their respective grooves are in contact with each other the two fixtures define an air filled metallic rectangular waveguide 20. Apparatus 10 comprises one preferred embodiment that may be utilized for measuring the dielectric constant of unknown samples 12 which are the same length L. Samples 12 fill waveguide 20 on either side of septum 14 and are the same length as septum 14. Septum 14 is centered along the length of the fixtures 16a and 16b, and connects the grooved surfaces of mating fixtures 16a and 16b. Septum 14 divides the width a of waveguide 20. In a preferred embodiment, septum 14 is preferably comprised of metal such as brass. Guide pins 18 may be utilized to connect fixtures 16a and 16b, which close around septum 14, and samples 12.

In the areas in front of and behind septum 14, waveguide 20 is filled with air and its lower cutoff frequency $f_c$ is determined from equation (1). The characteristic impedance of waveguide 20 in the air-filled region is real for $f>f_c$ and is:

$$Z_1 = \frac{k_0 \eta_0}{\sqrt{k_0^2 - k_{c0}^2}} \quad (2)$$

where:

$$k_0 = \frac{2\pi f}{c}, k_{c0} = \frac{\pi}{a}, \eta_0 = 377\Omega \quad (3)$$

In the region of waveguide 20 at septum 14 and samples 12, the cutoff is defined by equation (1) where a is replaced by a/2, because septum 14 cuts width a of waveguide 20 in half. Therefore, the impedance of waveguide 20 in this region is imaginary so long as $$f < \frac{c}{a\sqrt{\varepsilon_r}} \quad (4)$$

and this impedance will be:

$$Z_2 = j \frac{k\eta}{\sqrt{k_c^2 - k^2}} \quad (5)$$

with:

$$k = \frac{2\pi f \sqrt{\varepsilon_r}}{c}, k_c = \frac{2\pi}{a}, \eta = \frac{\eta_0}{\sqrt{\varepsilon_r}} \quad (6)$$

From transmission line theory, the total reflection coefficient seen looking into the section of the waveguide 20 containing the samples 12 and the septum 14 is:

$$\Gamma = \Gamma_1 \frac{1 - e^{-j2L\sqrt{k^2 - k_c^2}}}{1 - \Gamma_1^2 e^{-j2L\sqrt{k^2 - k_c^2}}} \quad (7)$$

where L is the length of samples 12 in meters and:

$$\Gamma_1 = \frac{Z_2 - Z_1}{Z_2 + Z_1} \quad (8)$$

When $\varepsilon_r>1$, it can be shown there exists at least one frequency at which equation (7) is nearly zero, indicating that this is a place where the impedance match looking into the near evanescent section around septum 14 of waveguide 20 is good.

Figure 2:
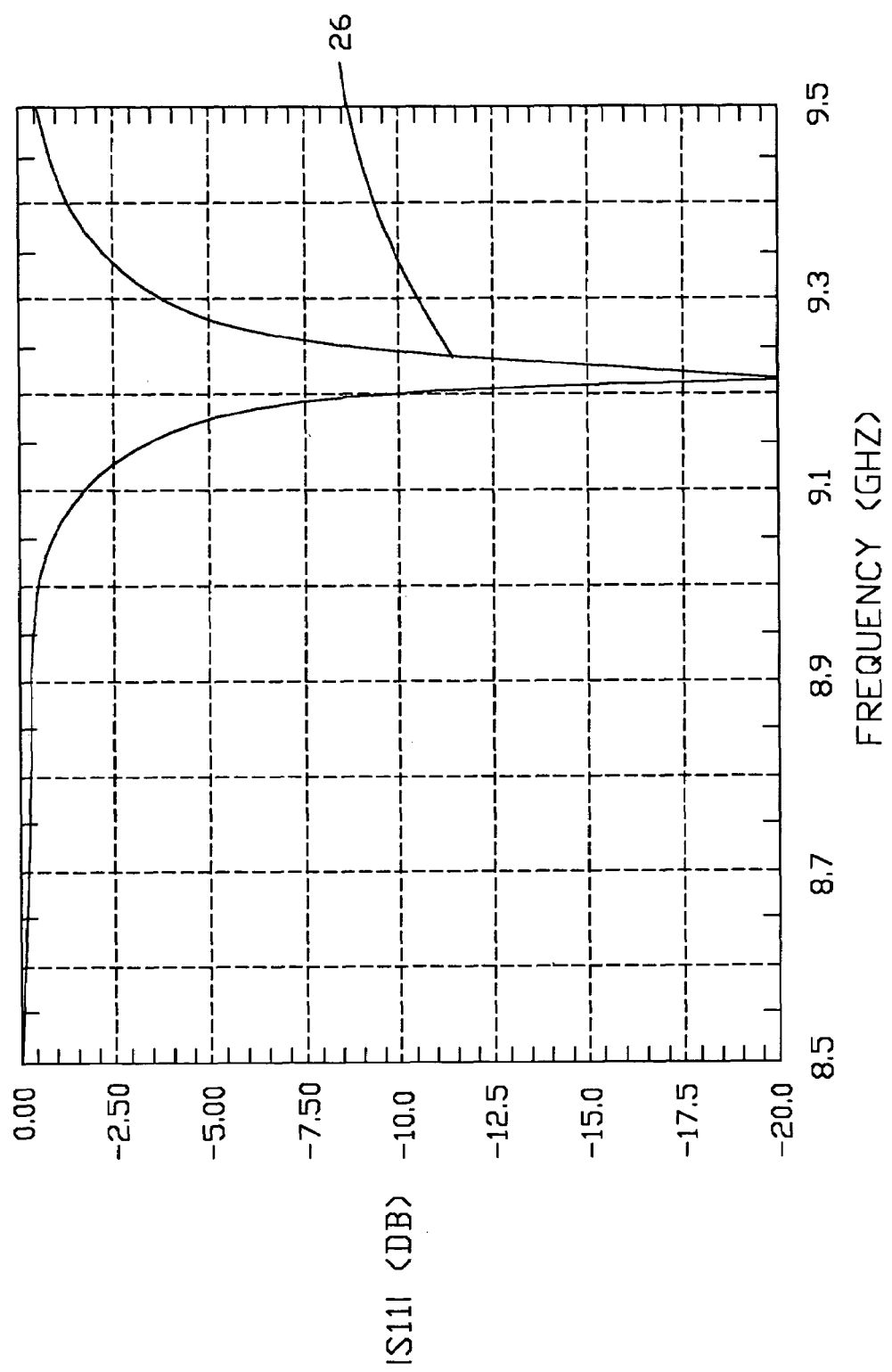
FIG. 2 is a graph of the frequency response of the waveguide of FIG. 1 with a Teflon sample therein in accord with one embodiment of the invention.
Figure 3:
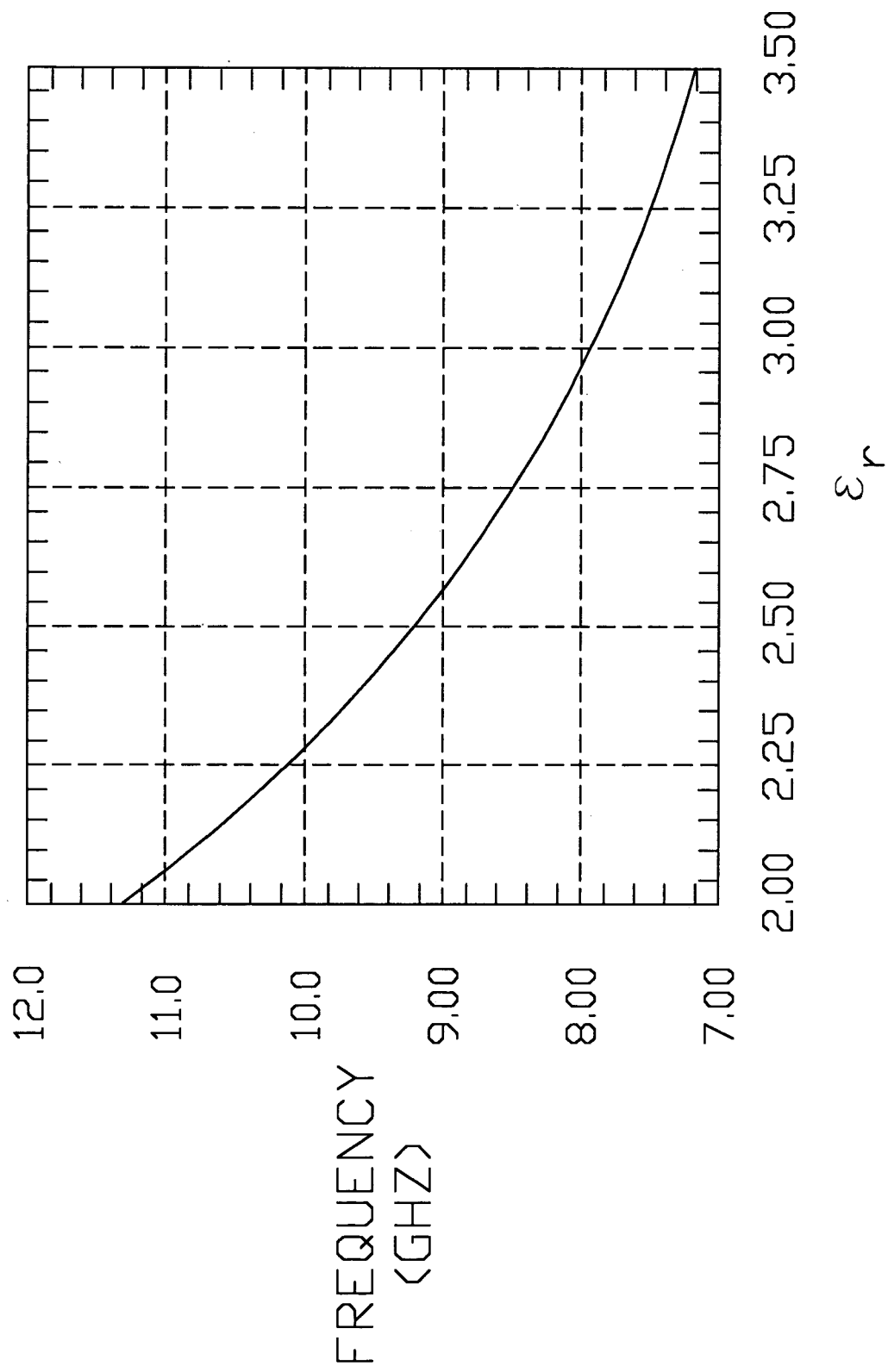
FIG. 3 is a graph of resonant frequency versus dielectric constant that may be utilized to visually determine the dielectric constant from the frequency response in accord with one embodiment of the present invention.

An example is shown in FIG. 2 for 0.5 inch long Teflon-type samples $\varepsilon_r$=2.5) placed in a WR90 standard rectangular waveguide (a=0.900 inches, b=0.400 inches). In FIG. 2, the value of |S11|=20*log₁₀(|Γ₁|) for apparatus 10 versus frequency is plotted. The location of minimum 26 can be easily and accurately measured using a network analyzer. The location of minimum 26 in FIG. 2 is a strong function of $\varepsilon_r$, but is not a strong function of L, the length of samples 12. This means that it is possible to establish an accurate one-to-one correspondence between the location of minimum or spike 26 in the response and the value of $\varepsilon_r$ without having to accurately measure the length L of samples 12. (Note: The length L of samples 12 determines the number of such spikes in the |S11| response, but does not appear to play a major role in the location of the lowest order spike 26.) This correspondence has been computed for a nominal sample length of 0.500 inches in a WR90 standard rectangular waveguide and is shown in FIG. 3, which may be utilized for visually determine $\varepsilon_r$ from minimum 26. It is worth noting in FIG. 3, that it can be seen that a small change in $\varepsilon_r$ will give an appreciable change in the location of spike 26, making accurate characterization of the sample possible.

Figure 4:
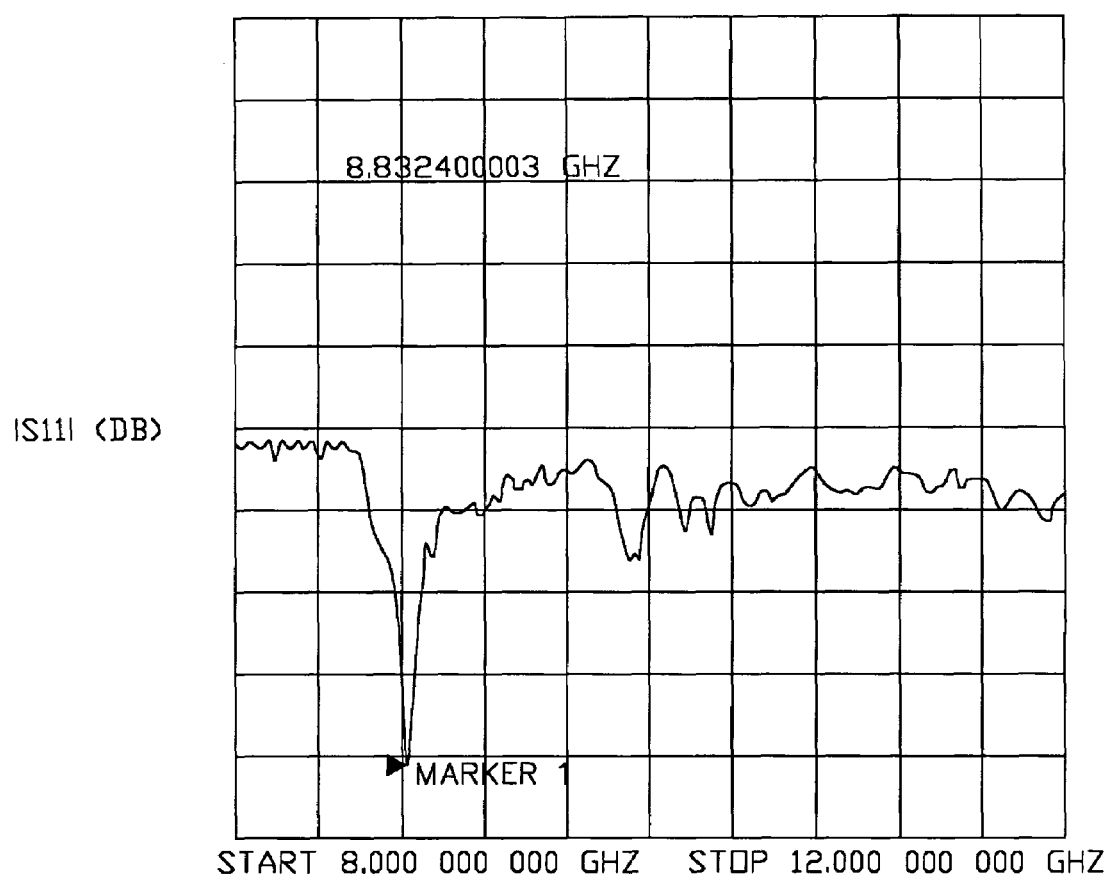
FIG. 4 is a graph of the frequency response the waveguide of FIG. 1 with an unknown material therein whereby the dielectric constant is determined from the graph of FIG. 3 after the lowest order minimum frequency response of the waveguide is determined utilizing a network analyzer in accord with one embodiment of the present invention.

FIG. 4 shows the results of a test of the present invention wherein apparatus 10 is utilized to determine the $\varepsilon_r$ of samples of an unknown material placed therein. The minimum in |S11| takes place at 8.83 GHz. Therefore, FIG. 3 visually indicates a dielectric constant of around 2.66. The material was in fact a fiberglass reinforced polystyrene plastic, and its dielectric constant is known to be in the vicinity of 2.62. The measurement, then, is in good agreement with the known properties (within 1.5%).

Figure 5:
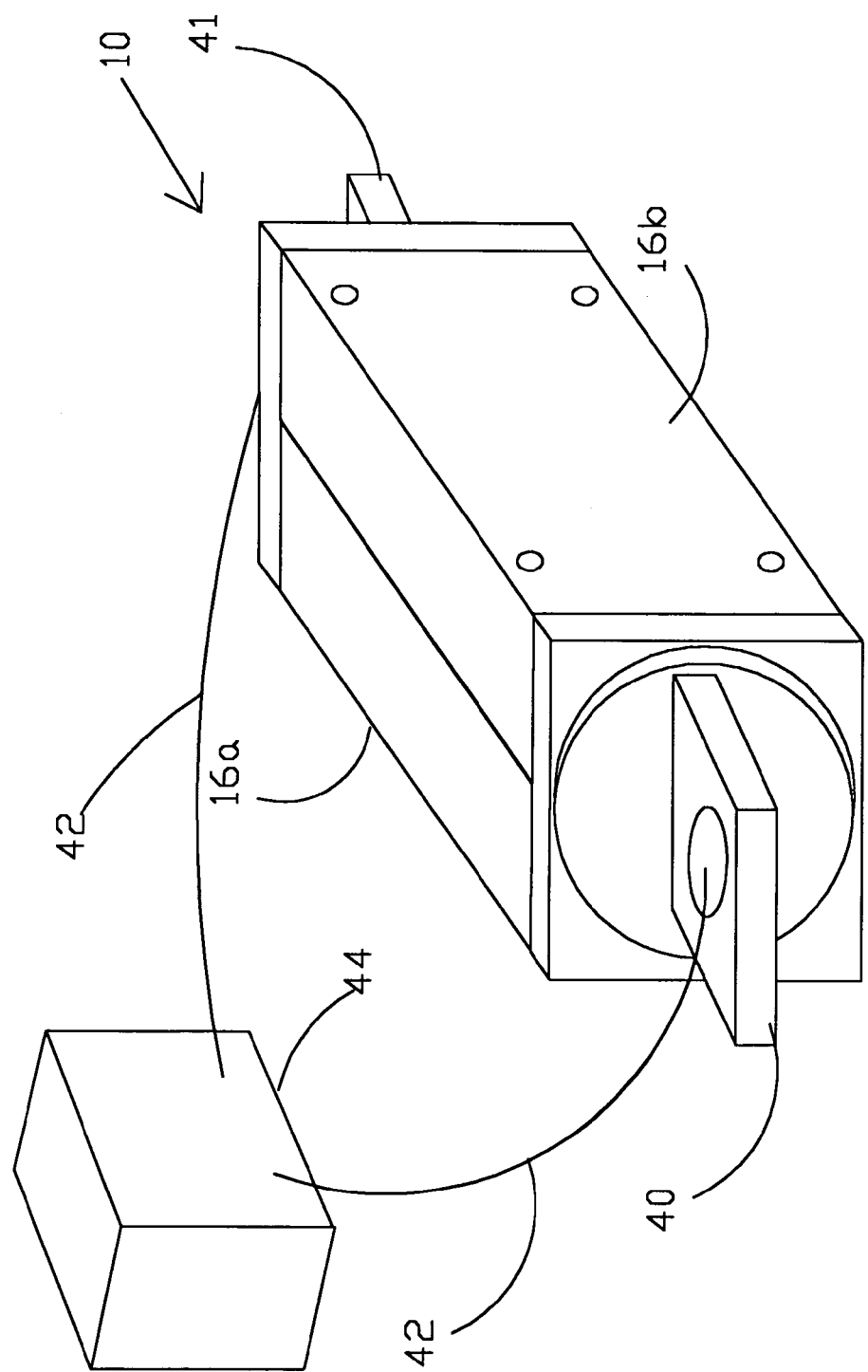
FIG. 5 is a perspective view of the dielectric constant waveguide measuring apparatus connected to a vector network analyzer via coaxial cables in accord with the present invention.

In summary of the operation of apparatus 10, one example of the method of use provides for preparing two samples 12 of material that may be 0.45 inches wide, 0.400 inches tall, and 0.500 inches long. The two samples 12 are inserted into waveguide 20 on either side of septum 14 as indicated in FIG. 1 whereupon outer fixtures 16a and 16b are closed together using guide pins 18 and preferably tightened with screws. FIG. 5 shows waveguide to coax adapters 40 and 41 are connected to each end of waveguide 20. Using stand coax cables 42, waveguide 10 is then connected to a calibrated vector network analyzer 44. The vector network analyzer is an important tool for measuring the complex impedance of a circuit at a given frequency. In this case, an HP 8720C network analyzer was utilized. The HP 8720C is a high performance microwave vector network analyzer used for measurements of reflection and transmission parameters of circuits or systems. This analyzer covers a frequency range of 50 MHz to 20 GHz. The position of the lowest order spike in the |S11| response is located. Then the graph of FIG. 3 or the equations provided hereinbefore are utilized to compute $\epsilon_r$.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A method for determining a dielectric constant of an unknown material, comprising:
   providing a first half waveguide frame having a plurality of sides, a midpoint and a longitudinal rectangular groove along one side;
   providing a second half waveguide frame identical to said first half waveguide frame;
   mating said first half waveguide frame and said second half waveguide frame to form a full waveguide frame defining an aperture that is a rectangular cross-section waveguide, having a height b and a width a that is at least twice the height b, wherein the lowest order cutoff frequency of said waveguide guide is expressed as, $$f_c = \frac{c}{2a\sqrt{\varepsilon_r}}$$

where c is the velocity of light ($3\times10^8$ m/s), a is the width of the waveguide in meters, and $\epsilon_r$ is the dielectric constant of any material filling the waveguide;
   inserting a solid metal septum between the first half waveguide frame and the second half waveguide frame to define two reduced cross-sectional areas of equal volume for a corresponding portion of said rectangular cross-section waveguide, wherein said solid metal septum creates a constant cutoff frequency mode in the part of said rectangular cross-section waveguide in which the septum is inserted;
   sizing two samples of said unknown material wherein both samples are sized to fit within one of each of said two reduced cross-sectional areas for a corresponding portion of said rectangular cross-section waveguide, each sample having a length l in meters;
   inserting said at two identically shaped samples of said unknown material, one each into one of said two reduced cross-sectional areas for a corresponding portion of said rectangular cross-section waveguide, such that one sample is on either side of said septum;
   plotting a first graph of frequency values versus the dielectric constant of any material in said rectangular cross-section waveguide where the value of the total reflection coefficient as expressed as $$\Gamma = \Gamma_1 \frac{1 - e^{-j2L\sqrt{k^2-k_c^2}}}{1 - \Gamma_1^2 e^{-j2L\sqrt{k^2-k_c^2}}}$$

is zero for a sample of said material of length L=l in meters, where $$\Gamma_1 = \frac{Z_2 - Z_1}{Z_2 + Z_1}, Z_1 = \frac{k_0 \eta_0}{\sqrt{k_0^2 - k_{c0}^2}}$$

and $$Z_2 = j\frac{k\eta}{\sqrt{k_c^2 - k^2}},$$

and where $$k = \frac{2\pi f \sqrt{\varepsilon_r}}{c}, k_c = \frac{2\pi}{a}, \eta = \frac{\eta_0}{\sqrt{\varepsilon_r}}, k_0 = \frac{2\pi f}{c}, k_{c0} = \frac{\pi}{a},$$

and $\eta_0 = 377\Omega$ in said rectangular cross-section waveguide, having a height b and a width a that is at least twice the height b, wherein $Z_1$ is the characteristic real impedance of said rectangular cross-section waveguide in the region in front of and behind said metal septum for a frequency greater than the lowest order cutoff frequency, and wherein $Z_2$ is the characteristic imaginary impedance of said rectangular cross-section waveguide in the region of the metal septum for a frequency less than or equal to the lowest order cutoff frequency;
   plotting a second graph of a frequency response through said full waveguide frame with said two samples therein versus the value of $|S11|=20*\log_{10}(|\Gamma_1|)$ using a calibrated vector network analyzer to measure the input reflection coefficient;
   determining a lowest order minimum frequency response from said second graph of frequency response versus the value of $|S11|=20*\log_{10}(|\Gamma_1|)$; and
   determining a dielectric constant of said two samples of unknown material from said lowest order minimum frequency response of said full waveguide frame by comparing the frequency value that correspond to the dielectric constant of any material where the value of the total reflection coefficient is zero as plotted in said first graph.

* * * * *